United States Patent
Rauscher et al.

(10) Patent No.: US 11,758,704 B2
(45) Date of Patent: Sep. 12, 2023

(54) PANEL FOR A MAGNETIC SHIELDING CABIN, MAGNETIC SHIELDING CABIN AND METHOD FOR THE PRODUCTION OF A PANEL AND A MAGNETIC SHIELDING CABIN

(71) Applicant: Vacuumschmelze GmbH & Co. KG, Hanau (DE)

(72) Inventors: Gerd Rauscher, Alzenau (DE); Markus Hein, Hanau (DE); Maximilian Staab, Mömbris (DE); Niklas Volbers, Bruckköbel (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 1128 days.

(21) Appl. No.: 16/437,942

(22) Filed: Jun. 11, 2019

(65) Prior Publication Data

US 2019/0387651 A1 Dec. 19, 2019

(30) Foreign Application Priority Data

Jun. 14, 2018 (DE) .................... 10 2018 114 258.7

(51) Int. Cl.
| | | |
|---|---|---|
| *H05K 9/00* | (2006.01) | |
| *H01F 1/147* | (2006.01) | |
| *B32B 37/12* | (2006.01) | |
| *B32B 37/18* | (2006.01) | |
| *B32B 21/02* | (2006.01) | |
| *C09J 175/04* | (2006.01) | |
| *C09J 201/10* | (2006.01) | |
| *B32B 7/12* | (2006.01) | |

(52) U.S. Cl.
CPC ........... *H05K 9/0075* (2013.01); *B32B 21/02* (2013.01); *B32B 37/12* (2013.01); *B32B 37/18* (2013.01); *C09J 175/04* (2013.01); *C09J 201/10* (2013.01); *H01F 1/14716* (2013.01); *B32B 7/12* (2013.01); *B32B 2307/208* (2013.01); *B32B 2307/212* (2013.01)

(58) Field of Classification Search
CPC ...... H05K 9/0075; B32B 21/02; B32B 37/12; B32B 37/18; B32B 7/12; B32B 2307/208; B32B 2307/212; B32B 2307/732; B32B 2607/00; B32B 15/10; B32B 2250/02; B32B 2307/56; B32B 3/10; B32B 15/20; B32B 2250/03; B32B 2250/04; B32B 7/03; B32B 15/18; B32B 2309/02; B32B 2309/12; C09J 175/04; C09J 201/10; H01F 1/14716

See application file for complete search history.

(56) References Cited

U.S. PATENT DOCUMENTS

| | | | |
|---|---|---|---|
| 3,657,025 A | 4/1972 | Pfeifer | |
| 4,441,940 A | 4/1984 | Pfeifer et al. | |
| 5,210,373 A | 5/1993 | Weber | |
| 6,282,848 B1 * | 9/2001 | Schlapfer | H05K 9/0001 |
| | | | 52/480 |
| 2005/0162249 A1 | 7/2005 | Simola | |

FOREIGN PATENT DOCUMENTS

| | | |
|---|---|---|
| DE | 1178878 A | 10/1964 |
| DE | 1219694 A | 6/1966 |
| DE | 1222271 A1 | 8/1966 |
| DE | 1758152 B | 6/1971 |
| DE | 2446986 C3 | 4/1976 |
| DE | 3031257 A1 | 3/1982 |
| DE | 4029498 A1 | 3/1992 |
| GB | 922212 A | 3/1963 |
| GB | 945066 A | 12/1963 |

OTHER PUBLICATIONS

Cemedineadhesive.com; Cemedine Super-X, Super-X 8008, Adhesive & Sealant dated Apr. 23, 2018.
Produktinformation/Technisches Merkblatt, Technicoll® 8324, 1-K-PUR-Klebstoff, gute Kunststoffhaftung, Ruderer Klebetechnik Gmbh • 85604 Zorneding • Harthauser Straße 2.

* cited by examiner

*Primary Examiner* — Daniel H Lee
(74) *Attorney, Agent, or Firm* — Dickinson Wright PLLC

(57) ABSTRACT

A panel for a shielding cabin having a base plate made of a non-magnetic material and at least one sheet layer made of a soft magnetic material is provided. The base plate is stuck to at least one sheet layer by a viscoelastic adhesive. The adhesive has a glass transition temperature of −80° C. to −60° C.

19 Claims, 3 Drawing Sheets

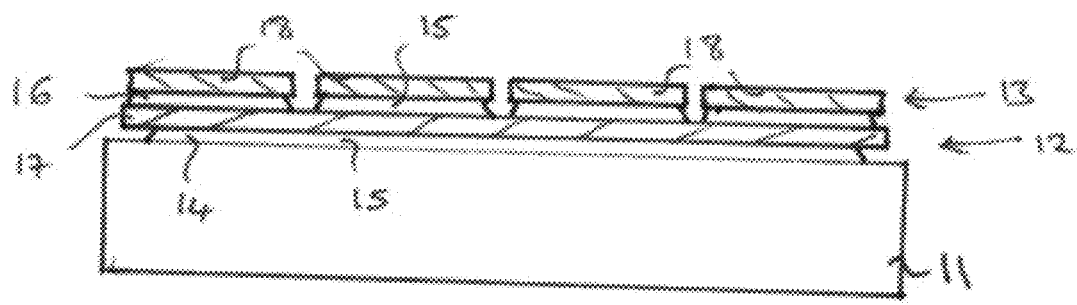
Fig. 1
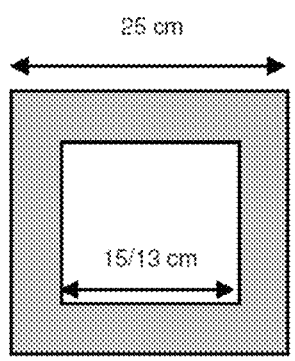
Fig. 2
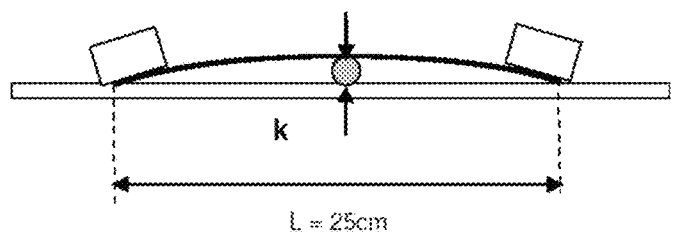

PANEL FOR A MAGNETIC SHIELDING CABIN, MAGNETIC SHIELDING CABIN AND METHOD FOR THE PRODUCTION OF A PANEL AND A MAGNETIC SHIELDING CABIN

This application claims the benefit of German patent application DE 10 2018 114 258.7, filed on Jun. 14, 2018, the entire contents of which is incorporated herein by reference for all purposes.

BACKGROUND

1. Technical Field

The invention relates to a panel for a magnetic shielding cabin, a magnetic shielding cabin and a method for the production of a panel and a magnetic shielding cabin.

2. Related Art

Magnetic shielding cabins are used in the medical and research fields, for example, to shield magnetically sensitive devices such as magneto-encephalography systems (MEG) against external magnetic fields. The effectiveness of a shielding cabin is specified by means of the shielding factor S and the so-called residual field. The shielding factor is calculated from the quotients of the calculated strength of an exciting periodic magnetic field outside the shielding cabin and the strength measured inside the shielding cabin. Apart from the spatial dimensions of a cabin, the shielding factor itself is determined substantially by the relative permeability p of the wall material, typically sheets of a soft magnetic material.

$$S \approx const \cdot \mu$$

The strength of the residual field in a shielding cabin indicates the extent to which very static magnetic fields surrounding the cabin (primarily the earth's magnetic field at approx. $B=4 \cdot 10^{-5}$ T) are suppressed.

In some applications the vibration characteristics of the shielding cabin must also be taken into consideration, as a magnetic sensor that oscillates in an inhomogeneous magnetic field records oscillating values for the magnetic field strength. U.S. Pat. No. 6,282,848 B1 discloses a construction for a shielded cabin in which the floor, the ceiling and the walls of the cabin are magnetically and dielectrically separated from the building in which the shielded cabin is located. A further damping means is integrated in the floor construction to prevent mechanical oscillations outside the cabin being transmitted into the cabin.

It is, however, desirable to simplify the construction of a shielding cabin whilst at the same time providing good magnetic shielding and oscillation damping.

SUMMARY

The object of the invention is therefore to produce a magnetic shielding cabin that performs well and offers improved oscillation damping.

The object is achieved by the subject-matter of the independent claims. Advantageous developments form the subject-matter of the various dependent claims.

The invention provides for a panel for a shielding cabin, in particular a magnetic shielding cabin. The panel comprises a base plate made of a non-magnetic material and at least one sheet layer made of a soft magnetic material. The base plate is connected to the at least one sheet layer by means of a viscoelastic adhesive. The adhesive has a glass transition temperature of −80° C. to −60° C., preferably −75° C. to −65° C.

A viscoelastic adhesive is thus used to attach the soft magnetic sheets that provide the magnetic shielding function to a base plate. In addition to this attaching function, the viscoelastic adhesive provides an additional oscillation-damping effect without using a further component. The panel is thus simple to produce. Moreover, the viscoelastic adhesive prevents a reduction in the permeability of the sheet layer caused by bending or tension forces, in particular during the manufacture of the panel, so making it possible to improve the effectiveness of the magnetic shielding.

In the panel construction according to the invention, the individual sheets are stuck together in a stable but flexible and oscillation-damping manner. This prevents the build-up of local stresses and makes the magnetic conductivity less susceptible to sheet undulations. Furthermore, the sheet panels can be stuck flexibly to a non-magnetic, oscillation-damping substrate. This increases their stability and at the same time further reduces their susceptibility to vibrations.

According to the invention, the adhesive used therefore has both elastic and viscous properties. The adhesive has a glass transition temperature of −80° C. to −60° C., preferably −75 to −65° C., the temperature being measured at 10 K/min by means of differential scanning calorimetry (DSC). This glass transition is not present in crystalline adhesives such as silicon, for example.

In one embodiment the adhesive has a Shore A hardness according to DIN 53505 within a range of 30 to 60, preferably a Shore A hardness according to DIN 53505 within a 20 range of 35 to 45, and a tensile shear strength according to DIN 53504 of at least 0.3 N/mm², preferably a tensile shear strength according to DIN 53504 of at least 0.9 N/mm².

The flexibility of the adhesive is provided by the properties of a Shore A hardness according to DIN 53505 within a range of 30 to 60 and a tensile shear strength according to DIN 53504 of at least 0.3 N/mm². The hardness describes the elasticity of the adhesive. A viscoelastic adhesive with a Shore A hardness according to DIN 53505 within a range of 30 to 60 is very soft and so suitable for oscillation damping. The tensile shear strength describes the adhesive strength. With a tensile shear strength according to DIN 53504 of at least 0.3 N/mm² the adhesive is suitable for reliable sticking heavy metal sheets together.

In one embodiment the adhesive is a silane-modified polymer (SMP) adhesive. This class of adhesives has viscoelastic properties and has proved particularly suitable.

An alternative adhesive with a suitable Shore A hardness according to DIN 53505 and tensile shear strength according to DIN 53504, which is suitable for certain applications, is a polyurethane (PUR) adhesive.

In order to further improve oscillation damping, in some embodiments the base plate is made of an oscillation-damping material. In some embodiments a non-metallic base plate, which is also electrically insulating, can be used. In one embodiment the base plate is made of medium-density fibreboard (MDF).

For applications in which resonant mechanical oscillations within a range of 0 to 20 Hz are to be avoided, a base plate made of aluminium has proved unsuitable in testing since at typical shielding panel dimensions (approx. 1.2 m×1.2 m) it oscillates resonantly within a range of 0 to 20 Hz. Some magnetic sensors are particularly sensitive in this frequency range.

The soft magnetic material of the sheet layer provides the magnetic shielding. In one embodiment the sheet layer consists of a nickel-iron alloy that contains, for example, 70 to 82 wt % nickel, 0 to 11 wt % copper, 0 to 6.5 wt % molybdenum, 0 to 6 wt % chromium and the rest iron, the minimum iron content being 9% wt %. (wt % denotes weight percent.)

The nickel-iron alloy can contain, for example, 76 to 78 wt % nickel, 4.0 to 5.0 wt % copper, 2.8 to 3.8 wt % molybdenum and at least 13 wt % iron, or 79 to 81 wt % nickel, 4.6 to 5.6 wt % molybdenum and at least 13 wt % iron, or 80 to 82 wt % nickel, 5.5 to 6.5 wt % molybdenum and at least 10 wt % iron. A suitable nickel-iron alloy is commercially available under the trade name Mumetall.

A panel typically has at least one linear dimension of at least 0.8 m. However, during heat treatment of the soft magnetic material to set its magnetic properties, in particular permeability smaller dimensions are practical. In one embodiment the sheet layer takes the form of a plurality of sheets arranged side by side on the base plate. This arrangement has the advantage that the sheets or strips can be manufactured using a simpler production process and then any number of sheets or strips can be stuck together side by side on the base plate in order to produce a panel of the desired dimensions. The dimensions of the panel are thus independent of the dimensions of the soft magnetic material, for example of the width of the strips.

In some embodiments the panel has at least two sheet layers placed one on top of the other. These sheet layers can each consist of a plurality of sheets arranged side by side, and the sheets of adjacent layers can run crosswise in relation to one another. The sheet layers can be attached to one another by means of the flexible adhesive.

A magnetic shielding cabin having panels according to any of the preceding embodiments is also provided.

In one embodiment the shielding cabin has a plurality of shielding shells and at least one of these shielding shells has panels according to any of the preceding embodiments. The magnetic properties of soft magnetic materials such as nickel-iron alloys can be impaired by tension forces, e.g. bending. In one embodiment the panel has an effective permeability of greater than 20,000 after installation in a shielding cabin when shielding a magnetic flow density of 1.4±0.5 µT RMS. The panel can have one linear dimension greater than 0.8 m. The mechanical vibration of the panel when installed can have a maximum acceleration amplitude of 0.3 ms$^{-2}$ RMS within a frequency range of 0 to 500 Hz, and so provide an oscillation-damping effect.

The principle of magnetic shielding is based on the fact that the magnetic flow present is conducted around the space to be shielded. The (relative) permeability of a magnetic material corresponds to its magnetic conductivity and so indicates how effectively it conducts the flow around the shielded space. For a high permeability the local magnetisation in the material should be as unhindered as possible and be able to rotate isotropically, i.e. without a preferred direction. Nickel-iron alloys such as Mumetall are characterised by very low magnetocrystalline anisotropy. In addition, Mumetall has very low magnetostriction, i.e. its dimensions change only slightly under the influence of an applied magnetic field. The effect is, however, great enough for preferred magnetic directions to be generated if bending or tension forces are applied to Mumetall sheet. The resulting anisotropy leads to a decrease in permeability.

Due to the processes involved, Mumetall sheets are slightly undulating after high-temperature annealing. If the annealed sheets are stuck together under high pressure and using a less flexible adhesive such as an adhesive foil, the sheets are then pressed very flat. Due to the inflexible adhesive foil, however, the stresses this causes cannot be removed. This produces very different magnetic anisotropies at the local level, which impair the optimum conduction of the magnetic flow through the sheet. Moreover, unavoidable effects such as vibrations or a slight twisting of the panels under their own weight can lead to a build-up of stresses.

These effects can be avoided by the use of a viscoelastic adhesive, thereby producing a shielding cabin with good effectiveness and oscillation damping. In addition, the sheet panels can be stuck flexibly to a non-metal, oscillation-damping substrate. This increases their stability and at the same time further reduces their susceptibility to vibrations.

The invention provides for a method for the production of a panel for a shielding cabin. A shielding layer consisting of at least one sheet made of a soft magnetic material is attached to a non-magnetic base plate by use of a viscoelastic adhesive with a Shore A hardness according to DIN 53505 within a range of 30 to 60 and a tensile shear strength to according DIN 53504 of at least 0.3 N/mm$^2$. In one embodiment the sheet is then pressed onto the base plate with a maximum surface pressure of less than 1.5 t/m$^2$ (tonnes per meter squared), preferably no greater than 1 t/m$^2$, preferably no greater than 0.5 t/m$^2$.

The viscoelastic adhesive produces a panel that has good soft magnetic properties and so good magnetic shielding and oscillation-damping properties without further components being incorporated.

The maximum contact pressure can be selected such that a maximum reduction in permeability of the soft magnetic material is below a pre-determined limit. In one embodiment the reduction in permeability after adhesion is lower than 6%, preferably lower than 3%.

In one embodiment a plurality of sheets are attached side by side on the base plate by means of the adhesive to form a first shielding layer. In this manner it is possible to construct a panel of the desired dimensions using a standardised material such as strips of a standardised width.

In one embodiment at least a further sheet layer is placed on the sheet layer. A plurality of sheets can be attached side by side on the first sheet layer by means of the adhesive to form a second sheet layer, the sheets of the second layer being placed crosswise in relation to the sheets of the first layer.

The adhesive can have a glass transition temperature of −80° C. to −60° C., preferably −75° C. to −65° C., the glass transition being determined in a DSC measurement at a heating rate of 10K/min. The adhesive can have a Shore A hardness according to DIN 53505 within a range of 35 to 45 and a tensile shear strength according to DIN 53504 of at least 0.9 N/mm$^2$.

In one embodiment the adhesive is a silane-modified polymer (SMP) adhesive.

Alternatively, for some embodiments, e.g. for a base plate containing no aluminium, a polyurethane adhesive can be used.

The base plate can be non-metallic and/or electrically insulating. The base plate can comprise an oscillation-damping material such as medium-density fibreboard (MDF).

The soft magnetic material can consist of a nickel-iron alloy that contains 70 to 82 wt % nickel, 0 to 11 wt % copper, 0 to 6.5 wt % molybdenum, 0 to 6 wt % chromium and the rest iron, the minimum iron content being 9 wt %.

In further embodiments the nickel-iron alloy contains 76 to 78 wt % nickel, 4.0 to 5.0 wt % copper, 2.8 to 3.8 wt % molybdenum and at least 13 wt % iron, or 79 to 81 wt % nickel, 4.6 to 5.6 wt % molybdenum and at least 13 wt % iron, or 80 to 82 wt % nickel, 5.5 to 6.5 wt % molybdenum and at least 10 wt % iron.

The panel can have one linear dimension greater than 0.8 m.

A plurality of panels according to any of the preceding embodiments can be used to form a shielding cabin. The panels can be produced according to any of the preceding embodiments.

A shielding cabin can comprise further components such as connecting pieces that are assembled with the panels to build the shielding cabin or a shell of a shielding cabin. The flexible adhesive can also be used to connect the panels to these further components. For example, at least one of the panels can be attached to a further connecting piece by means of the flexible adhesive to form the shielding cabin.

The mechanical vibration of the panels within a frequency range of 0 to 500 Hz when installed can be characterised by a maximum acceleration amplitude of 0.3 ms$^{-2}$ RMS.

To summarise, there are provided a panel, a magnetic shielding cabin and/or a shell of a shielding cabin that exhibit good magnetic shielding and improved oscillation damping. The composite comprising a base plate and soft magnetic sheets is produced by means of a flexible adhesive such as a viscoelastic adhesive that provides an additional oscillation-damping effect as well as attaching the soft magnetic sheets to the base plate without using a further component. The panel is therefore easy to produce. Furthermore, the flexible adhesive avoids a reduction in the permeability of the sheet layer caused by bending of or tension forces on the sheet layer, in particular during the production of the panel, thereby permitting an improvement in the effectiveness of the magnetic shielding.

BRIEF DESCRIPTION OF THE DRAWINGS

Embodiments are explained in greater detail below with reference to the drawings.

FIG. 1 shows a schematic view of a panel according to the invention.

FIG. 2 shows the set-up for measuring a bending parameter k of a panel.

DETAILED DESCRIPTION OF EXAMPLE EMBODIMENTS

Figure 3:
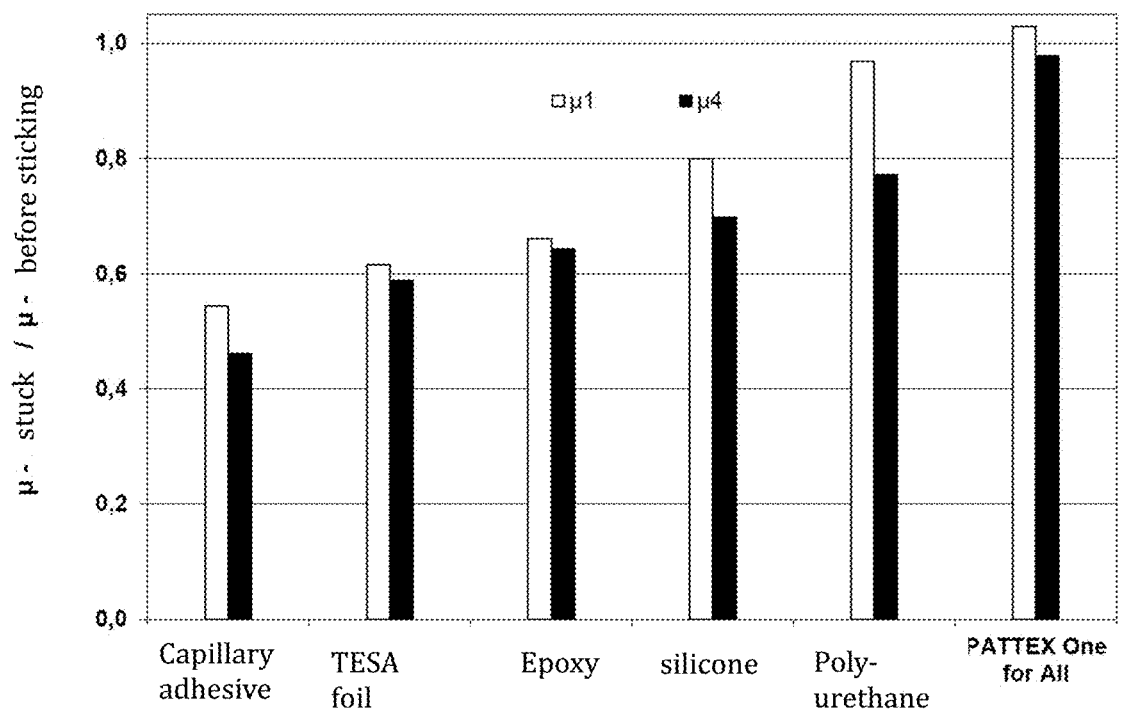
FIG. 3 shows the relative change in permeability values in two measurement frames made of Mumetall caused by using different adhesives.

FIG. 1 shows a schematic view of a cross-section of a panel 10 according to any embodiment.

The panel 10 has a base plate 11 made of a non-magnetic material and two sheet layers 12, 13 made of a soft magnetic material. The lower sheet layer 12 is attached to the base plate by a layer 14 of a viscoelastic adhesive, for example a silane-modified polymer adhesive 15. The upper sheet layer is also attached to the lower sheet layer 12 by a layer 16 of silane-modified polymer adhesive 15.

Each of the sheet layers 12, 13 comprises a plurality of sheets or strips 17, 18 arranged side by side, the strips 17, 18 running crosswise in relation to one another. The panel 10 can, however, also comprise one single sheet layer or more than two sheet layers. In panels with three or more sheet layers the strips of adjacent layers run crosswise in relation to one another.

The sheet layers 12, 13 or strips 17, 18 are made of a soft magnetic material such as a nickel-iron alloy like Mumetall, for example. The soft magnetic material has a high permeability that provides magnetic shielding. The base plate 11 is made of medium-density fibreboard (MDF).

According to the invention, a viscoelastic adhesive such as a silane-modified polymer, for example, is used. A silane-modified polymer adhesive 15 is flexible and has a glass transition temperature of between −75° C. and −65° C., a Shore A hardness according to DIN 53505 within a range of 30 to 60 and a tensile shear strength according to DIN 53504 of at least 0.3 N/mm$^2$. The panel and a shielding cabin constructed of a plurality of such panels have good magnetic shielding and good oscillation damping and are easy to produce.

Silane hybrid adhesives (silane-modified polymers (SMP)) are a class of adhesives with a combination of properties that which are advantageous for sticking shielding wall panels together, for example they adhere to Mumetall surfaces without the use of a primer and are temperature-resistant and UV-stable. In addition, such adhesives are particularly viscoelastic.

These excellent properties distinguish SMP adhesives from PU and silicone adhesives, which also have a high elasticity. SMP adhesives also exhibit a marked viscosity, which has the effect of damping oscillations and shocks. The company Soudal provides SMP adhesive Soudaseal 2K that was found to be particularly suitable for the applications described here. An important parameter for the elasticity of an adhesive is its hardness, i.e. the resistance of the elastomer to the mechanical penetration of another body. As a typical representative of the SMP class, Soudaseal 2K has a Shore A hardness of 40±5 on a scale of 0-100 (DIN 53505) and is therefore relatively soft. At the same time, its adhesion at a specified tensile shear strength of >1.3 MPa (DIN 53504) is exceptionally high and it is therefore suitable for reliably sticking together a plurality of heavy metal sheet layers.

In some applications, a polyurethane adhesive is also suitable for the low-stress adhesion of sheets to a base plate. Due to the portion of amorphous components, however, the softness of this adhesive can be set within a wide range. The higher the amorphous portion, the lower the glass transition temperature. In testing, the PU adhesive Technicoll 8324 1-K-PUR proved both relatively elastic and sufficiently adhesive and its softness was reflected in a glass transition temperature (10 K/min) of approx. −66° C., characteristics similar to those of SMP adhesives. The PU adhesive tested has a Shore A hardness and a tensile shear strength similar to those of the SMP adhesive.

Some polyurethane adhesives require the use of more production steps than SMP adhesives, e.g. the activation of the adhesive and a longer setting time. Adhesive tests showed that the polyurethane adhesive impairs the permeability of the panel more significantly than SMP adhesives at high modulations. Consequently, polyurethane adhesives are less suitable for applications with a requirement for very high magnetic shielding than SMP adhesives.

The base plate can be made of a non-metallic material and also be electrically insulating.

In the test, a base plate made of aluminium proved unsuitable for applications in which it is necessary to avoid resonance frequencies within a range of 0 to 20 Hz as such plates, when they have the dimensions typical of shielding panels (approx. 1.2 m×1.2 m), oscillate resonantly within a range of 0 to 20 Hz. Some magnetic sensors are particularly sensitive in this frequency range. In one embodiment aluminium is therefore excluded as the base plate material.

A panel comprising a base plate made of MDF and sheet layers made of Mumetall sheets was produced using various adhesives and tested. To give the wall panel a sufficient degree of stability and flatness, the bottom sheet layer is stuck to a base plate. The base plate can comprise an oscillation-damping material such as medium-density fibreboard (MDF). A 19 mm thick plate made of medium-density fibreboard (MDF) proved a suitable base plate. In addition to its excellent flatness and rigidity, MDF has strong oscillation-damping properties. The many branched wood fibres in the material have the effect of distributing any energy introduced by mechanical excitation widely throughout the plate and converting it into thermal energy.

Wall panels for a shielding cabin are produced in this manner and measure up to approx. 1.50 m×1.50 m in size. The panel can consist one or more sheet layers of Mumetall, e.g. four to six sheet layers, each measuring 0.5 mm to 0.75 mm thick, for example. Each sheet layer comprises sheet strips measuring approx. 30 cm×150 cm, for example. The sheets in two adjacent layers are rotated by 90° in relation to one another ("attached cross-wise").

FIG. 2 shows the test set-up. Two measurement frames (external dimension 25 cm) were cut from annealed Mumetall sheets, which were then stuck together in two layers (2×0.75 mm). The permeability of these measurement frames was then examined under varying degrees of bending. The bending put the Mumetall under strain. An important parameter for the quality of shielding plates is permeability at a modulation of H=1 mA/cm, often designated as $\mu 1$. Accordingly, the permeability at a modulation of H=4 mA/cm is often designated as $\mu 4$.

Tests were carried out to ascertain the loss of permeability in double-layered measurement frames as a result of adhesion alone, i.e. without any macroscopic mechanical bending. The results are shown in FIG. 3. It shows the relative changes in permeability levels $\mu 1$ and $\mu 4$, resulting from the comparison of values before and after bonding. It plots six different classes of adhesive including a TESA adhesive foil, a flexible silicone adhesive, a flexible polyurethane (PU) adhesive and an SMP adhesive in the form of PATTEX One for All. The use of the flexible PU adhesive also tested and the SMP adhesive, PATTEX One for All, resulted in a lesser worsening in permeability than the silicone adhesive. The SMP adhesive stood out because both $\mu 1$ and $\mu 4$ remained almost equally high after adhesion. The PU adhesive tested had only a slight adverse effect on $\mu 1$ at least.

Various different SMP adhesives were tested. Adhesion was determined by measuring tensile shear strength on test strips. The results are summarised in Table 1. In the test, two sheet strips were stuck together and then pulled apart. The adhesive Soudaseal 2K exhibited the greatest tensile shear strength of all the adhesives tested.

TABLE 1

| Adhesive | Tensile shear strength [N/mm$^2$] |
|---|---|
| Soudal Fix All Flexi | 1.07 |
| Soudal Fix All Crystal | 1.40 |
| Heller 2H | 1.19 |
| PATTEX PL 300 | 0.30 |
| Soudaseal High Tack | 0.70 |
| Soudaseal 2K | 1.83 |

The influence of contact pressure on permeability when sticking together the Mumetall sheets was examined.

Figure 4:
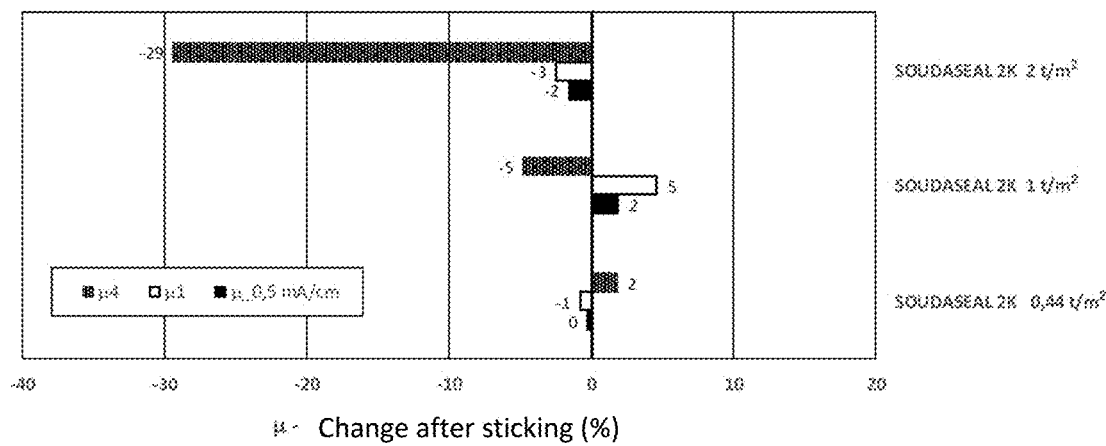
FIG. 4 shows the relative change in permeability values of an SMP adhesive as a function of the contact pressure selected.

FIG. 4 shows the influence of contact pressure on the relative change in permeability after sticking together two-layered measuring frame. It shows permeability levels $\mu$ (H=0.5 mA/cm), $\mu 1$ and $\mu 4$. At a relatively low contact pressure of 0.44 t/m$^2$ the relative change in permeability is very low at −1% to +2% irrespective of the modulation examined. At an increased contact pressure of 1 t/m$^2$, approx. 0.1 bar, the changes become more clearly evident. $\mu 4$ decreases by 5%, while $\mu 1$ improves slightly by 5%.

An even higher contact pressure of 2 t/m$^2$ leads to a clear reduction in permeability, above all at higher modulations and $\mu 4$, even though initial permeability $\mu 1$ does not yet fall excessively at this contact pressure. A value of 2 t/m$^2$ or 0.2 bar is accepted as an upper limit for a reasonable contact pressure.

A small series of 24 panels were produced and made into a closed test shell for the SMP adhesive Soudaseal 2K. The panels comprised four layers of Mumetall sheets with a thickness of 0.75 mm stuck together at low stress and the oscillation-damping MDF base plate with a thickness of 19 mm. The prior art consists of sticking sheets together without an additional base plate. The test shell was set up inside an existing standard double-shelled cabin.

The first series of tests comprised measurements of the shielding factor of the triple-shelled shielding cabin. The shielding factors and permeability of the standard cabin were already known. Using analytical calculations and after comparison with data from FEM simulation it was possible to determine the wall permeability of the test shell to $\mu \approx 21,000 \pm 1000$.

Figure 5:
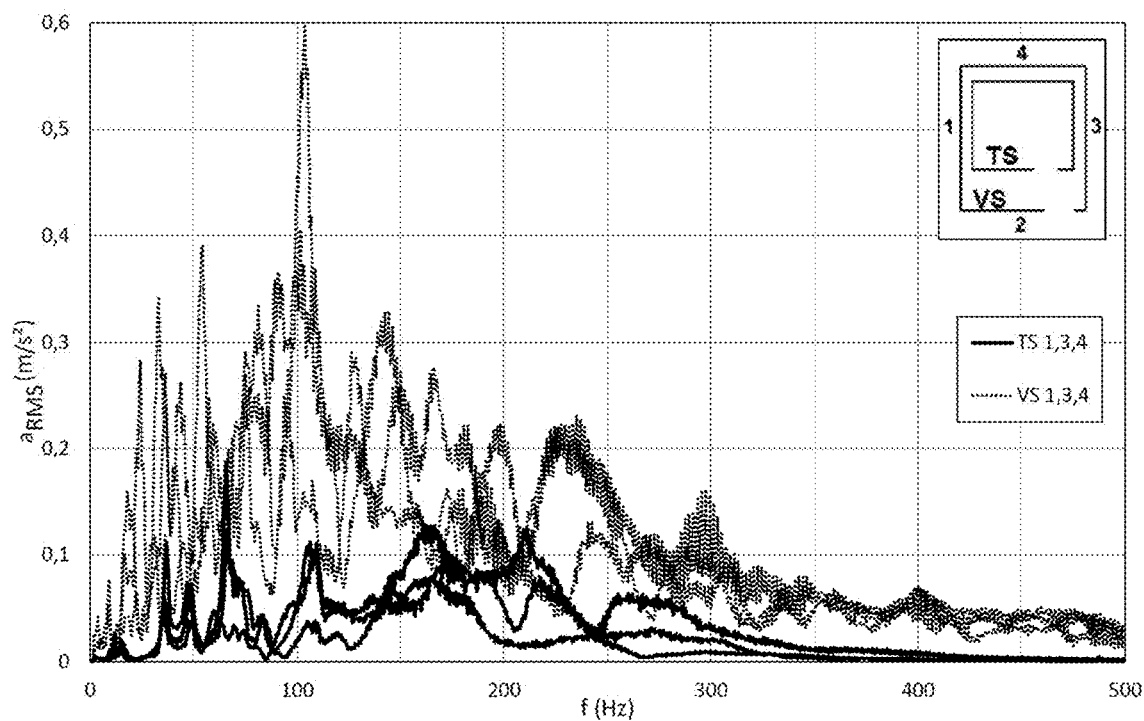
FIG. 5 shows the oscillation behaviour of the side walls of comparison shells (VS) and test shells according to the invention (TS) according to any embodiment.

In addition, oscillation measurements were carried out at the walls of both the test shell and the standard cabin. The method used consisted of mounting an acceleration sensor directly on the wall in question in a relatively central position. Low-frequency excitation was effected manually using a rubber hammer. The results of the comparative oscillation measurements are shown in FIG. 5.

The frequency spectrum of the vibrations of the individual walls is plotted from 0 to 500 Hz, the strength of the vibration being expressed using acceleration a. The drawing at the top right of FIG. 5 illustrates the designation of the four side walls of the outer standard cabin VS and the test shell TS respectively. Side wall 2 is the door side of the cabin. The door side 2 has been omitted from the drawing due to the particular construction around the door and the panel dimensions, which are adjusted accordingly. The dimensions of the individual walls and the distances between the wall mountings vary both between VS and TS and within the individual shells. As a result the resonance frequencies of the individual walls differ significantly. However, a comparison of all the side walls of TS (continuous line) to those of VS (dotted line) reveals that the new wall panel exhibited resonances of lesser amplitude due to the damping MDF components. For example, the highest resonance of all the VS walls was a=0.6 m/s² RMS, while the maximum resonance of the TS walls was below 0.2 m/s² RMS.

An SMP adhesive has a characteristic glass transition that can be determined by dynamic differential calorimetry (DSC) measurement. The temperature of a small adhesive sample is changed continually and the amount of heat absorbed or given off is determined. Attention should be paid to the details of the rate at which the temperature in the DSC measurement changes since the measured transition temperatures shift depending on the rate. The curves shown and the glass transition temperatures relate to a rate of 10 K/min.

Figure 6:
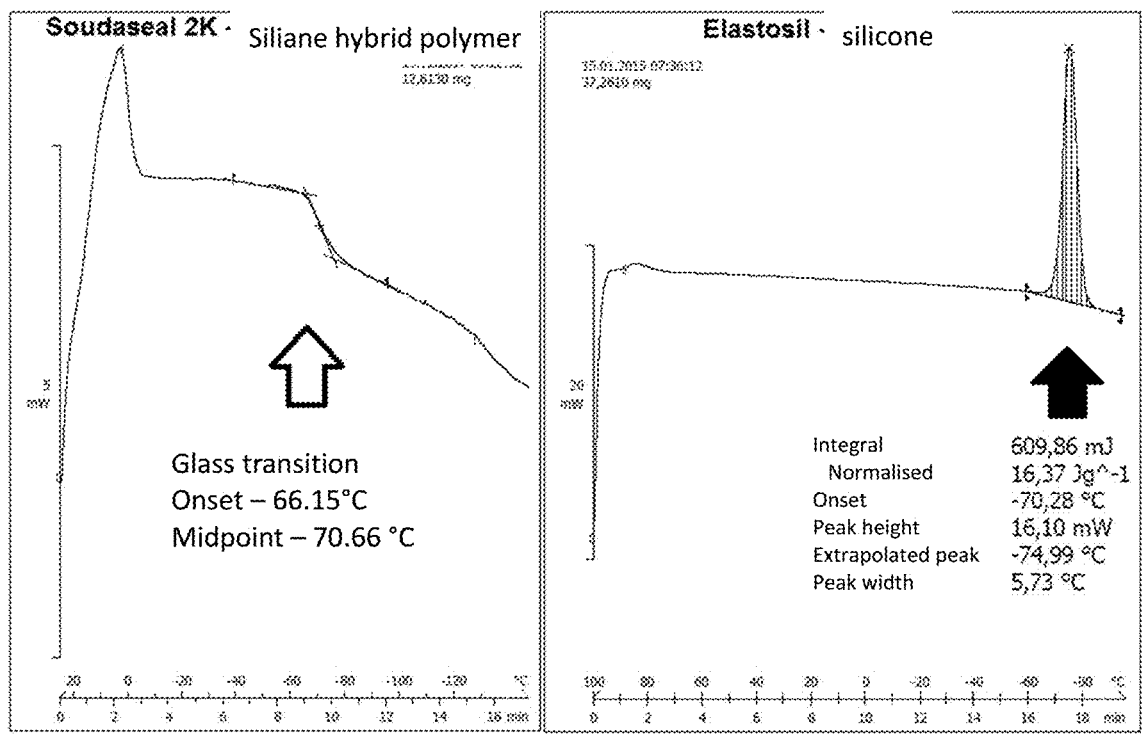
FIG. 6 shows results of DSC measurements (10 K/min) of an adhesive according to any embodiment and of a comparison adhesive.

It is possible by means of DSC measurements to identify crystallisation processes and glass transition temperatures, for example. These are characteristic of amorphous and crystalline materials. FIG. 6 shows DSC measurements on Soudaseal 2K, an SMP adhesive, on the left and on Elastosil, a silicon-rubber-based comparison adhesive, on the right.

The glass transition of Soudaseal 2K is clearly visible at approx. −71° C. It manifests itself as a local change in the increase in a limited temperature range. In the same temperature range, by contrast, the silicon-based comparison sample records a strong local increase with a peak at approx. −75° C. This increase is explained by a crystallisation process.

Results for different SMP adhesives and other classes of adhesive are summarised in Table 3. All SMP adhesives tested exhibited a glass transition at similar temperatures, on average at −72.61° C. Amongst the comparison adhesives Technicoll 1-K-PUR, the polyurethane adhesive tested, proved the most similar to the SMP adhesives. It, too, exhibited a glass transition, though at a somewhat higher temperature of approx. −66° C. The 3M 583 adhesive foil had a clearly lower glass transition temperature of −119.38° C. The two silicon-rubber-based adhesives tested (including Elastosil, FIG. 6) differed from the other adhesives tested in the nature of the transition. They exhibited a partially crystalline behaviour in the form of a crystallisation peak.

TABLE 2

| Class of adhesive | Product tested | Type of transition | Temperature [° C.] |
| --- | --- | --- | --- |
| Silyl modified polymer | Soudaseal 2K | Glass transition | −70.66 |
| Silyl modified polymer | Soudaseal High Tack | Glass transition | −74.40 |
| Silyl modified polymer | Soudal Fix All Crystal | Glass transition | −71.74 |
| Silyl modified polymer | Soudal Fix All Flexi | Glass transition | −70.98 |
| Silyl modified polymer | Pattex PL300 | Glass transition | −74.06 |
| Silyl modified polymer | Pattex One For All | Glass transition | −73.80 |
| Polyurethane | Technicoll 1-K-PUR | Glass transition | −66.01 |
| Adhesive foil (synth. elastomer with thermoplastic, resin) | 3M foil 583 | Glass transition | −119.38 |
| 1K silicone rubber, cures at room temperature | Elastosil | Crystallisation | −74.99 |
| 1K silicone rubber, cures at room temperature | DELO-GUM 3597 | Crystallisation | −73.80 |

To summarise, a panel is provided for a magnetic shielding cabin in which the individual sheets can be stuck together in a stable but flexible and oscillation-damping manner. This prevents the build-up of local stresses and makes the magnetic conductivity less susceptible to sheet undulations. Moreover, the sheet panels are stuck flexibly to a non-metallic, oscillation-damping base plate, thereby increasing their stability and at the same time reducing their susceptibility to vibrations.

KEY TO DRAWINGS

FIG. 3
μ—stuck/μ—before sticking
Capillary adhesive
TESA foil
Epoxide
Silicone
Polyurethane
PATTEX One for All
FIG. 4
μ—Change after sticking (%)
FIG. 6
Soudaseal 2K—silane hybrid polymer
Glass transition
Onset
Midpoint
Elastosil—silicone
Integral
Normalised
Onset
Peak height
Extrapolated peak
Peak width

The invention claimed is:

1. A panel for a shielding cabin comprising: a base plate made of a non-magnetic material and at least one sheet layer made of a soft magnetic material, the base plate being connected to the at least one sheet layer by a viscoelastic adhesive, the adhesive having a glass transition temperature of −80° C. to −60° C.

2. A panel according to claim 1, wherein the adhesive has a Shore A hardness according to DIN 53505 within a range of 30 to 60 and a tensile shear strength according to DIN 53504 of at least 0.3 N/mm².

3. A panel according to claim 1, wherein the adhesive has a Shore A hardness according to DIN 53505 within a range of 35 to 45 and a tensile shear strength according to DIN 53504 of at least 0.9 N/mm².

4. A panel according to claim 1, wherein the adhesive is a silane-modified polymer (SMP) adhesive.

5. A panel according to claim 1, wherein the adhesive is a polyurethane adhesive.

6. A panel according to claim 1, wherein the base plate is made of an oscillation-damping material.

7. A panel according to claim 6, wherein the base plate is made of medium-density fibreboard (MDF).

8. A panel according to claim 1, wherein the base plate is not made of aluminium.

9. A panel according to claim 1, wherein the soft magnetic material comprises a nickel-iron alloy containing 70 to 82 wt % nickel, 0 to 11 wt % copper, 0 to 6.5 wt % molybdenum, 0 to 6 wt % chromium and the rest iron, the minimum iron content being 9 wt %.

10. A panel according to claim 9, wherein the nickel-iron alloy contains 76 to 78 wt % nickel, 4.0 to 5.0 wt % copper, 2.8 to 3.8 wt % molybdenum and at least 13 wt % iron.

11. A panel according to claim 9, wherein the nickel-iron alloy contains 79 to 81 wt % nickel, 4.6 to 5.6 wt % molybdenum and at least 13 wt % iron.

12. A panel according to claim 9, wherein the nickel-iron alloy contains 80 to 82 wt % nickel, 5.5 to 6.5 wt % molybdenum and at least 10 wt % iron.

13. A panel according to claim 1, wherein the sheet layer comprises a plurality of sheets arranged side by side on the base plate.

14. A panel according to claim 13, wherein the panel comprises at least two sheet layers arranged one on top of the other, wherein the sheet layers each comprise a plurality of sheets arranged side by side and the plurality of sheets in adjacent layers extend crosswise in relation to one another and are attached to one another by means of the adhesive.

15. A panel according to claim 1, wherein the panel has one linear dimension greater than 0.8 m.

16. A magnetic shielding cabin according to claim 15, wherein the magnetic shielding cabin comprises a plurality of shielding shells, at least one of these shells having panels according to claim 1.

17. A magnetic shielding cabin comprising panels according to claim 1.

18. A magnetic shielding cabin according to claim 17, wherein at least one of the panels has an effective permeability of greater than 20,000 after installation in the shielding cabin when shielding a magnetic flow density of 1.4±0.5 µT RMS.

19. A magnetic shielding cabin according to claim 17, wherein the mechanical vibration of at least one of the panels when installed has a maximum acceleration amplitude of 0.3 ms$^{-2}$ RMS within a frequency range of 0 to 500 Hz.

* * * * *